(12) United States Patent
Lin et al.

(10) Patent No.: US 10,517,190 B2
(45) Date of Patent: Dec. 24, 2019

(54) ELECTRONIC DEVICE AND CONTROL METHOD THEREOF

(71) Applicant: ASUSTeK COMPUTER INC., Taipei (TW)

(72) Inventors: Hsin-Chen Lin, Taipei (TW); Ing-Jer Chiou, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 309 days.

(21) Appl. No.: 15/618,166

(22) Filed: Jun. 9, 2017

(65) Prior Publication Data

US 2017/0363097 A1 Dec. 21, 2017

(30) Foreign Application Priority Data

Jun. 17, 2016 (CN) .................... 2016 2 0597837 U

(51) Int. Cl.
*H05K 7/20* (2006.01)
*F04D 19/00* (2006.01)
(Continued)

(52) U.S. Cl.
CPC ............. *H05K 7/20* (2013.01); *F04D 19/007* (2013.01); *F04D 25/08* (2013.01); *F04D 27/005* (2013.01); *F04D 29/325* (2013.01); *F04D 29/522* (2013.01); *F04D 29/644* (2013.01); *F04D 17/164* (2013.01); *F04D 27/002* (2013.01); *F04D 29/281* (2013.01); *F04D 29/282* (2013.01); *F04D 29/403* (2013.01); *F04D 29/4226* (2013.01); *H05K 7/14* (2013.01); *H05K 7/18* (2013.01)

(58) Field of Classification Search
CPC .. F04D 29/281; F04D 29/403; F04D 29/4226; F04D 17/16; F04D 17/164; F04D 29/282; F04D 27/002; H05K 7/20; H05K 7/14; H05K 7/18
USPC ........................................................ 416/203
See application file for complete search history.

(56) References Cited

U.S. PATENT DOCUMENTS

| 4,135,850 A  * | 1/1979 | d'Anjou ................ F04D 29/464 137/637 |
| 6,318,964 B1 * | 11/2001 | Yang ..................... B29C 45/006 415/198.1 |
| 6,572,336 B2 * | 6/2003 | Horng .................... F04D 29/023 416/183 |

(Continued)

FOREIGN PATENT DOCUMENTS

CN 103807212 A 5/2014

*Primary Examiner* — Nathaniel E Wiehe
*Assistant Examiner* — Andrew J Marien
(74) *Attorney, Agent, or Firm* — McClure, Qualey & Rodack, LLP

(57) ABSTRACT

A fan module includes a first casing, a driving motor disposed in the first casing, a first rotor connected to the first driving motor, a second casing, a second rotor pivotally configured in the second casing, at least one guiding member and a shift apparatus connected to the first casing and the second casing, the first rotor includes a first rotating shaft and a plurality of first blades, the second rotor includes a second rotating shaft and a plurality of second blades, the guiding member is disposed on the first blade and the second blade. The whole height of the blade is adjusted by adjusting the distance between the two group blades, then the efficiency of the fan is improved effectively to optimize the noise level and the air flow.

12 Claims, 7 Drawing Sheets

(51) Int. Cl.
*F04D 25/08* (2006.01)
*F04D 27/00* (2006.01)
*F04D 29/32* (2006.01)
*F04D 29/52* (2006.01)
*F04D 29/64* (2006.01)
*H05K 7/18* (2006.01)
*H05K 7/14* (2006.01)
*F04D 29/40* (2006.01)
*F04D 29/42* (2006.01)
*F04D 29/28* (2006.01)
*F04D 17/16* (2006.01)

(56) References Cited

U.S. PATENT DOCUMENTS

| | | | | |
|---|---|---|---|---|
| 6,591,873 B1* | 7/2003 | McNeil | ............... | F01D 5/022 |
| | | | | 141/105 |
| 6,663,342 B2* | 12/2003 | Huang | ............... | F04D 29/542 |
| | | | | 415/121.2 |
| 6,799,942 B1* | 10/2004 | Tzeng | ............... | F04D 29/542 |
| | | | | 415/193 |
| 6,948,912 B2* | 9/2005 | Chang | ............... | F04D 29/329 |
| | | | | 416/185 |
| 7,083,386 B2* | 8/2006 | Horng | ............... | F04D 29/30 |
| | | | | 416/175 |
| 7,182,572 B2* | 2/2007 | Yang | ............... | F04D 29/325 |
| | | | | 415/175 |
| 7,445,423 B2* | 11/2008 | Ishihara | ............... | F04D 19/007 |
| | | | | 415/193 |
| 8,876,499 B2* | 11/2014 | Horng | ............... | F04D 17/04 |
| | | | | 361/695 |
| 9,206,808 B2* | 12/2015 | Yuan | ............... | F04D 25/166 |
| 10,202,981 B2* | 2/2019 | Lin | ............... | F04D 29/281 |
| 2004/0228722 A1* | 11/2004 | Horng | ............... | F04D 29/582 |
| | | | | 415/66 |
| 2005/0106026 A1* | 5/2005 | Oosawa | ............... | F04D 19/007 |
| | | | | 416/198 R |
| 2012/0219437 A1* | 8/2012 | Nakamura | ............... | A47L 5/22 |
| | | | | 417/423.1 |
| 2014/0193242 A1 | 7/2014 | Kuo et al. | | |

* cited by examiner

ELECTRONIC DEVICE AND CONTROL METHOD THEREOF

CROSS-REFERENCE TO RELATED APPLICATION

This application claims the priority benefit of China application serial No. 201620597837.3, filed on Jun. 17, 2016. The entirety of the above-mentioned patent application is hereby incorporated by references herein and made a part of specification.

BACKGROUND OF THE INVENTION

Field of the Invention

The invention relates to a fan module.

Description of the Related Art

In general, an electronic device, such as a notebook, a fan is usually configured to dissipate heat generated from internal electronic components while operation. A centrifugal fan is used to remove heat out of the electronic device via airflow. In general, a conventional fan module can be more efficiency by improving a blade structure and motor performance. However, the fan characteristics cannot be adjusted adaptively to meet different application requirements.

BRIEF SUMMARY OF THE INVENTION

A fan module is provided. The fan module includes a first casing; a first driving motor disposed in the first casing; a first rotor connected to the driving motor, the first rotor includes a first rotating shaft and a plurality of first blades, the multiple first blades are connected to the first rotating shaft; a second casing; a second rotor pivotally configured in the second casing, the second rotor includes a second rotating shaft and a plurality of second blades, the second blades are connected to the second rotating shaft; at least one guiding member disposed on the first blade or the second blade; and a shift apparatus connected to the first casing and the second casing and configured to drive the second casing to move relative to the first casing.

The whole height of the blades is adjusted by adjusting the distance between the two group blades, and the performance of the fan can be changed. Then the efficiency of the fan can be improved effectively to optimize the noise level and the air flow.

BRIEF DESCRIPTION OF THE DRAWINGS

These and other features, aspects and advantages of the invention will become better understood with regard to the following embodiments and accompanying drawings.

DETAILED DESCRIPTION OF THE EMBODIMENTS

Figure 1:
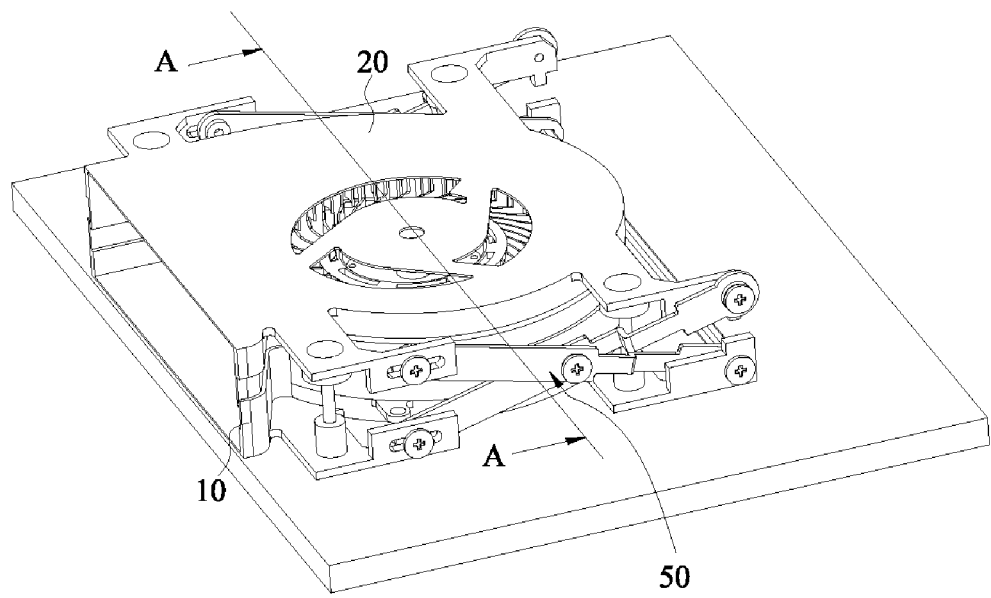
FIG. 1 is a schematic view of a fan module according to a first embodiment.
Figure 2A:
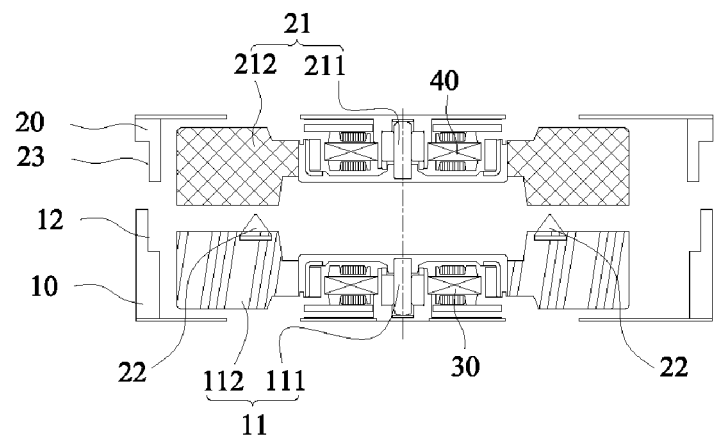
FIG. 2A is a sectional view of a fan module of which a first casing and a second casing are in a separation mode according to a first embodiment.
Figure 2B:
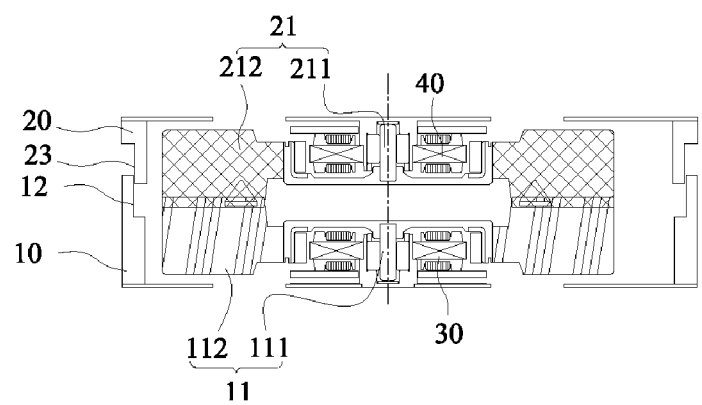
FIG. 2B is a sectional view of a fan module of which a first casing and a second casing are in a partly connection mode according to a first embodiment.
Figure 2C:
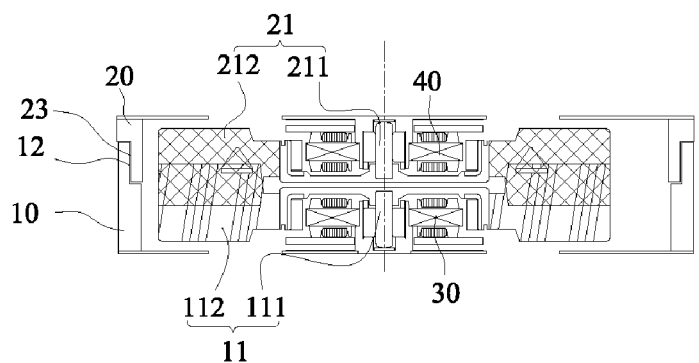
FIG. 2C is a sectional view of a fan module of which a first casing and a second casing are in a completely connection mode according to a first embodiment.
Figure 3:
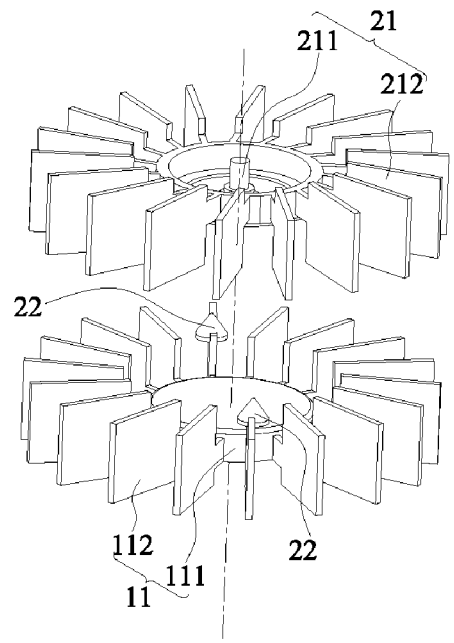
FIG. 3 is a schematic view showing a first rotor and a second rotor are in a completely separation mode according to a first embodiment.
Figure 4:
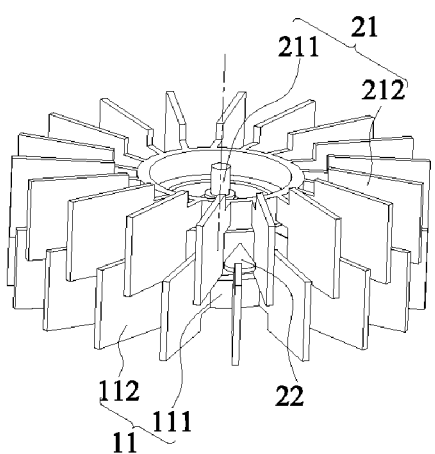
FIG. 4 is a schematic view showing a first rotor and a second rotor are in a partly connection mode according to a first embodiment.

Please refer to FIG. 1 to FIG. 4. FIG. 1 is a schematic view of a fan module according to a first embodiment. FIG. 2A is a sectional view of the fan module of which a first casing and a second casing are in a separation mode according to the first embodiment. FIG. 2A is a sectional view presented along a section of a line A-A in FIG. 1. FIG. 2B is a sectional view. In FIG. 2B, the second casing is moved downward towards the first casing until the first casing and the second casing are in a partly connection mode. FIG. 2C is a sectional view. In FIG. 2C, the second casing and internal components of the second casing are moved downward until the first casing and the second casing are in a completely connection mode. FIG. 3 is a schematic view showing a first rotor and a second rotor are in a completely separation mode according to the first embodiment. FIG. 4 is a schematic view showing a first rotor and a second rotor are in a partly connection mode according to the first embodiment. As shown in FIG. 1 and FIG. 2A, the fan module includes a first casing 10, a first rotor 11, a second casing 20, a second rotor 21, two guiding members 22, a first driving motor 30, a second driving motor 40 and a shift apparatus 50.

The first driving motor 30 is disposed in the first casing 10. The first rotor 11 is connected to the first driving motor 30 to make the first driving motor 30 drive the first rotor 11 to rotate. The first rotor 11 includes a first rotating shaft 111 and a plurality of first blades 112. The first rotating shaft 111 is connected to the first driving motor 30. The first blades 112 are connected to the first rotating shaft 111. Similarly, the second driving motor 40 is disposed in the second casing 20. The second rotor 21 is connected to the second driving motor 40 to make the second driving motor 40 drive the second rotor 21 to rotate. The second rotor 21 includes a second rotating shaft 211 and a plurality of second blades 212. The second rotating shaft 211 is connected to the second driving motor 40. The second blades 212 are connected to the second driving motor 40. By disposing driving motors on the first rotor 11 and the second rotor 21 respectively, the first rotor 11 and the second rotor 21 are driven, respectively, to rotate at a same rotating speed or at a different rotating speed when the first casing 10 and the second casing 20 are in a separation mode (as shown in FIG. 2A).

Please refer to FIG. 2A and FIG. 3, in the embodiment, the guiding member 22 is a cone-shaped structure disposed between two of the first blades 112. The number of the guiding members 22 is not limited herein. In another embodiment, one or more than two guiding member 22 is disposed, which is not limited herein. Moreover, in the embodiment, all the guiding members 22 are disposed on the first blades 112. In another embodiment, the guiding members 22 are also disposed on the second blades 212 toward to the first blades 112.

Please refer to FIG. 1, the shift apparatus 50 is connected to the first casing 10 and the second casing 20, and is configured to drive the second casing 20 to move relative to the first casing 10. In the embodiment, the shift apparatus 50 is a scissor-shaped linkage to adjust and configured to drive the second casing 20 to move relative to the first casing 10 while the second casing 20 and the first casing 10 are parallel. The scissor-shaped linkage can be moved or positioned by adjusting the clamping degree of the joint of the linkage. Moreover, in the embodiment, an axis of the first rotating shaft 111 and an axis of the second rotating shaft 211 are in a same axis line. When the shift apparatus 50 drives the second casing 20 towards or far away from the first casing 10, the second rotor 21 also has an axial displacement along the axis line through the axis center of the second rotating shaft 211.

With the configuration of two casings, two groups of rotors and a shift apparatus, heights of the fan frame and blades can be changed to adjust a length of the blades in an axial direction.

Please refer to FIG. 2A to FIG. 2C, in an embodiment, an inner side of the first casing 10 is a first recessed part 12 in an L-shape, and an outer side of the second casing 20 is a second recessed part 23 in an inverse L-shape. As shown in FIG. 2B, when the second casing 20 continually moves towards the first casing 10, the second recessed part 23 of the second casing 20 is connected correspondingly to the first recessed part 12 of the first casing 10. That is, a long side of the L-shape is fastened with a long side of the inverse L-shape, to make the second casing 20 be moved and positioned. As shown in FIG. 2C, when the second casing 20 moves downwardly to a position closest to the first casing 10, an end portion of the second casing 20 is accommodated and positioned in the first recessed part 12, and an end portion of the first casing 10 is accommodated and positioned in the second recessed part 23. A short side of the first recessed part 12 with an L-shape abuts against an end portion of the second casing 20. A short side of the second recessed part 23 with an inverse L-shape also abuts against an end portion of the first casing 10, to avoid that the second casing 20 moves downward continually. The first casing 10 and the second casing 20 are connected and positioned to each other via the first recessed part 12 and the second recessed part 23 which are in L-shapes.

With the above positioning structure, when the first casing 10 and the second casing 20 are close to each other, the first rotating shaft 111 of the first rotor 11 inside the first casing 10 does not contact with the second rotating shaft 211 of the second rotor 21 inside the second casing 20. Thus, a mutual influence between the first rotor 11 or the second rotor 21 in rotation is avoided.

Figure 5A:
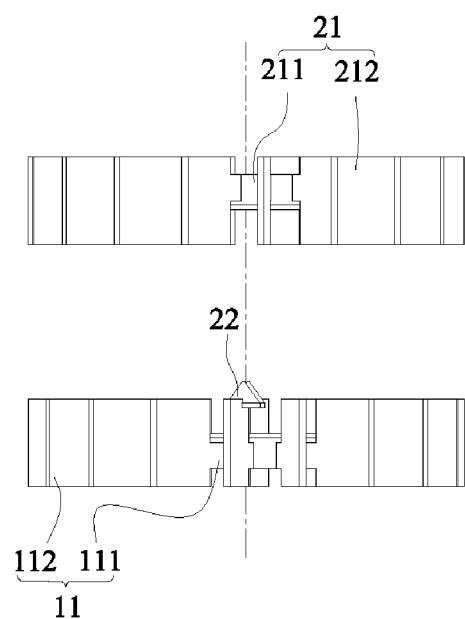
FIG. 5A is a side view showing a first rotor and a second rotor are in a completely separation mode according to a first embodiment.
Figure 5B:
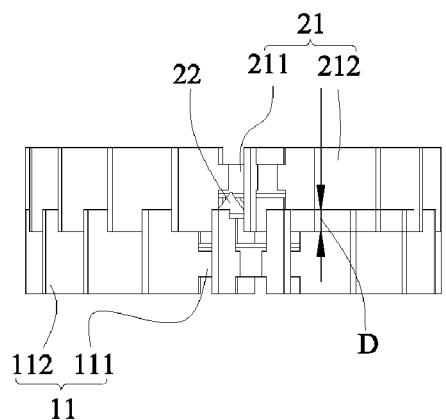
FIG. 5B is a side view showing a first rotor and a second rotor are in a partly connection mode according to a first embodiment.
Figure 5C:
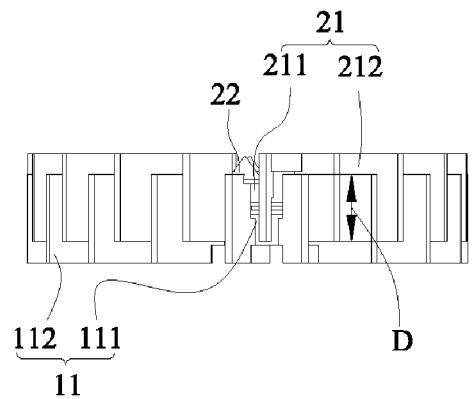
FIG. 5C is a side view showing a first rotor and a second rotor are in a completely connection mode according to a first embodiment.

Please refer to FIG. 2A to 2C, FIG. 3, FIG. 4 and FIG. 5A to FIG. 5C. FIG. 5A is a side view showing a first rotor and a second rotor are in a completely separation mode according to a first embodiment. FIG. 5B is a side view showing a first rotor and a second rotor are in a partly connection mode according to a first embodiment. FIG. 5C is a side view showing a first rotor and a second rotor are in a completely connection mode according to a first embodiment. FIG. 5A, FIG. 5B and FIG. 5C are schematic views showing that the first rotor 11 and the second rotor 21 are connected in different modes as shown in FIG. 2A to FIG. 2C from a side view. An operation mechanism of the fan module is described hereinafter accompanying FIG. 2A, FIG. 2B, FIG. 2C, FIG. 3, FIG. 4, FIG. 5A, FIG. 5B and FIG. 5C.

The first rotor 11 and the first driving motor 30 are disposed in the first casing 10. The second rotor 21 and the second driving motor 40 are disposed in the second casing 20. Consequently, when the shift apparatus 50 drives the first casing 10 and the second casing 20 to move, the first rotor 11 and the first driving motor 30 are moved along with the first casing 10, and also the second rotor 21 and the second driving motor 40 are moved along with the second casing 20. For more clarification, in the following description, in some figures, only the first rotor 11 and the second rotor 21 and position relations between the first rotor 11 and second rotor 21 are shown. Furthermore, the operation manner that the first rotor 11 moves relative to the second rotor 21 is described, but the operation of other components is omitted for clarification.

Please refer to FIG. 2A, FIG. 3 and FIG. 5A, the second casing 20 is moved up and close to the first casing 10, or is moved down and far away from the first casing 10 by adjusting the shift apparatus 50 shown in FIG. 1. When the shift apparatus 50 is moved to separate the second casing 20 from the first casing 10 and does not contact with the first casing 10 (that is a completely separation mode as shown in FIG. 2A), the first rotor 11 and the second rotor 21 rotate at a same or different speeds under the driving of the first driving motor 30 and the second driving motor 40, respectively, and then different wind speeds or air flows are generated.

Please refer to FIG. 2B, FIG. 4 and FIG. 5B again, to adjust the performance of the fan, the shift apparatus 50 is adjusted to make the second casing 20 move towards the first casing 10 until contacting the second casing 20 and partly accommodated in the first casing 10 (that is a partly connection mode shown in FIG. 2B. In FIG. 2B). The area of oblique lines for the first blade 112 and that of grid lines for the second blade 212 are defined as projection areas of the corresponding blade. However, in the partly connection mode, the projected areas of the first blade 112 and the second blade 212 are partly overlapped in a direction perpendicular to a surface of the blade, and the size of the overlapped area is changed with the movement of the second casing 20.

Please refer to FIG. 4, when the configuration is changed from the completely separation mode to the partly connection mode, and the second blade 212 is right above the first blade 112, the second blade 212 and the first blade 112 interferes to each other. At this time, with the guidance of the guiding member 22 disposed on the first blade 112, the second blade 212 is turned slightly to stagger with the first blade 112, which makes the second blade 212 be guided to a position between two of the first blades 112. In the embodiment, the guiding member 22 is in a cone shape. A diameter of the round bottom of the guiding member 22 is about equal to or less than the width between the two second blades 212. Under the guidance of an inclined plane with a cone shape, the second blades 212 are guided to a position between the two first blades 112 smoothly. Furthermore, since the diameter of the bottom round of the guiding member 22 is equal to or less than the width between the two second blades 212, the second blade 212 is guided and positioned in a specific position, and the first blade 112 and the second blade 212 rotate with a fixed distance therebetween. The distance between two blades is not changed during the rotation to avoid the interference with each other.

As shown in FIG. 5B, in the partly connection mode, the surface of the second blade 212 and that of the first blade 112 are partly overlapped in the direction perpendicular to the blade surface to form an overlapped area D. At the time, the first blade 112 and the second blade 212 are combined as a group blade at a side view. Thus the whole air guiding area of the fan is improved. When the fan is operated in the partly connection mode, a larger air flow is generated.

Please refer to FIG. 2C and FIG. 5C, to adjust the air guiding area of the fan, the second casing 20 continually moves towards the first casing 10 until the second casing 20 is engaged and positioned with the first casing 10 and cannot further move downward (that is a completely connection mode shown in FIG. 2C). As mentioned above, in the completely connection mode, the first casing 10 is closest to the second casing 20. As shown in FIG. 5C, in the embodiment of the completely connection mode, the overlapped area D between the second blade 212 and the first blade 112 is the largest. Even the first casing 10 and the second casing 20 are in the closest position, the surface of the second blade 212 is still not completely overlapped with the surface of the first blade 112. The overlapped area D between the second blade 212 and the first blade 112 can be adjusted in usage to change the size of the guiding area according to the requirement on the fan performance.

The height of the whole fan frame of the fan module is changed by adjusting the distance between the first casing 10 and the second casing 20 via the shift apparatus 50. At the same time, the relative position of the first rotor 11 and the second rotor 21 inside the fan module is also adjusted accordingly. In the completely separation mode, the first blade 112 and the second blade 212 are rotated at a same or different rate which are driven by the first driving motor 30 and the second driving motor 40 respectively to provide a required air flow or a required flow mode. In the partly connection mode, under the guidance of the guiding member 22, the second blade 212 is guided smoothly to a position between two first blades 112, which makes multiple first blades 112 and multiple second blades 212 rotate like a group of blade. In the partly connection mode, the overlapped area D of the first blade 112 and the second blade 212 can be adjusted to change the size of the blade in an axial direction. Then, the guiding area of the whole fan is changed. In the completely connection mode, with the position limiting structure of the first casing 10 and the second casing 20, the interference between the first rotor 11 and the second rotor 21 is avoided.

Figure 6A:
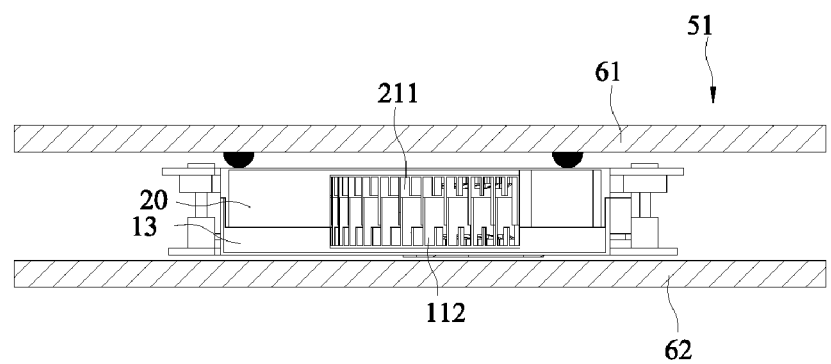
FIG. 6A is a side view of a fan module of which a first casing and a second casing are in a completely connection mode according to a second embodiment.
Figure 6B:
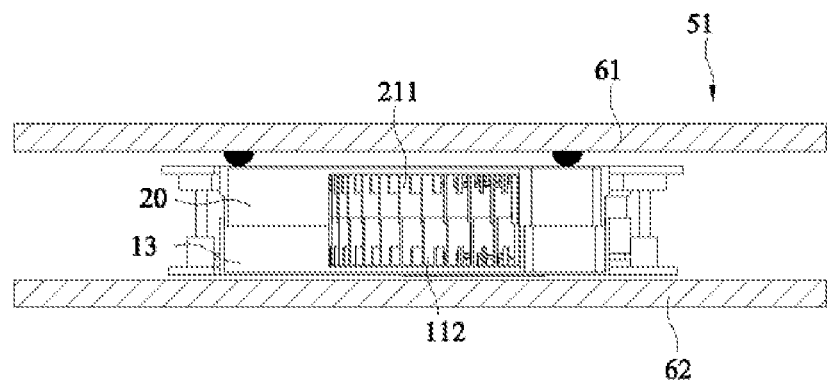
FIG. 6B is a side view of a fan module of which a first casing and a second casing are in a partly connection mode according to a second embodiment.
Figure 7A:
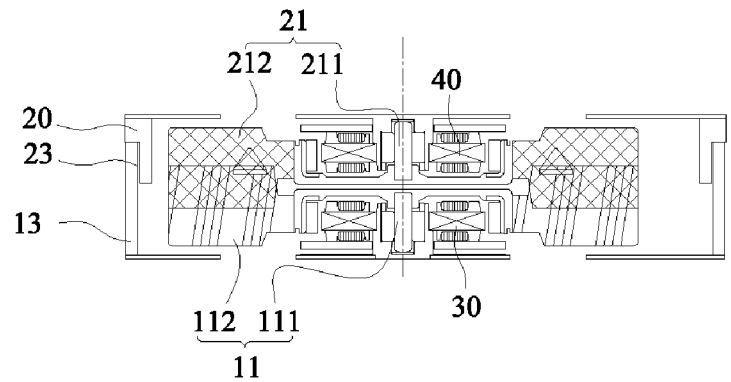
FIG. 7A is a sectional view of a fan module of which a first casing and a second casing are in a completely connection mode according to a second embodiment.
Figure 7B:
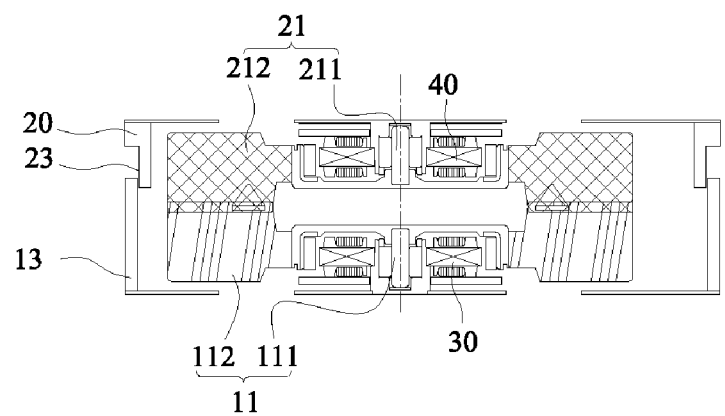
FIG. 7B is a sectional view of a fan module of which a first casing and a second casing are in a partly connection mode according to a second embodiment.

FIG. 6A, FIG. 6B, FIG. 7A and FIG. 7B are schematic diagrams of a fan module in a second embodiment. FIG. 6A is a side view of a fan module of which a first casing and a second casing are in a completely connection mode. FIG. 6B is a side view of a fan module of which a first casing and a second casing are in a partly connection mode. FIG. 7A is a sectional view of a fan module of which a first casing and a second casing are in a completely connection mode. FIG. 7B is a sectional view of a fan module of which a first casing and a second casing are in a partly connection mode. In FIG. 7A and FIG. 7B, the shift apparatus 51 in FIG. 6A and FIG. 6B is not shown.

In an embodiment, components and structures which are similar to that of the first embodiment are denoted by same symbols, which are not described in detail again. As shown in FIG. 6A and FIG. 6B, the difference between this embodiment and the first embodiment is that, the shift apparatus 51 includes a top cover 61 and a bottom cover 62 of an electronic device (not shown in figure). The second casing 20 is fixed to the top cover 61, and the first casing 13 is fixed to the bottom cover 62. The second casing 20 moves towards (as shown in FIG. 6A) or far away from (as shown in FIG. 6B) the first casing 13 by moving the top cover 61. In an embodiment, the top cover 61 is fixed to the second casing 20 via locking or bonding, and the bottom cover 62 is fixed to the first casing 13 via locking or bonding, which is not limited herein. In an embodiment, a screw structure, a hydraulic structure, and/or a multi-section hook structure is disposed between the top cover 61 and the bottom cover 62, to make the top cover 61 and the bottom cover 62 move relative to each other or fixed with each other.

Please refer to FIG. 7A and FIG. 7B, a second recessed part 23 of an inverted L-shape is formed on an outer surface of the second casing 20 as shown in FIG. 7B. When the second casing 20 moves close to the first casing 13, an end of the first casing 13 is accommodated and positioned in the second recessed part 23 while the short side portion of the second recessed part 23 abuts against the end of the first casing 13. Then, the positioning is completed.

Figure 8A:
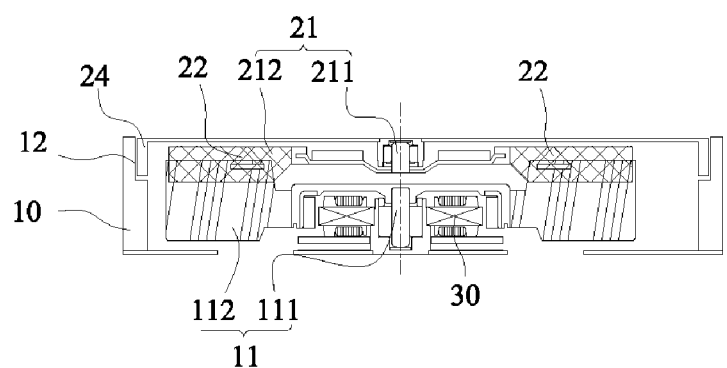
FIG. 8A is a sectional view of a fan module of which a first casing and a second casing are in a completely connection mode according to a third embodiment.
Figure 8B:
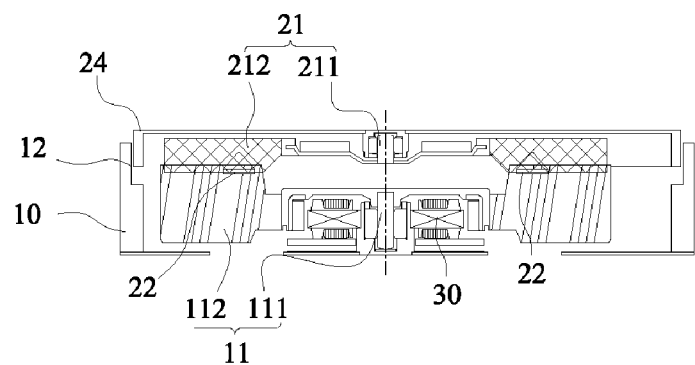
FIG. 8B is a sectional view of a fan module of which a first casing and a second casing are in a partly connection mode according to a third embodiment.

FIG. 8A and FIG. 8B are schematic views of a third embodiment. FIG. 8A is a sectional view of a fan module of which a first casing and a second casing are in a completely connection mode. FIG. 8B is a sectional view of a fan module of which a first casing and a second casing are in a partly connection mode. In FIG. 8A and FIG. 8B, the shift apparatus is not shown for clarity. In an embodiment, components and structures which are same with the first embodiment are identified with same symbols, which are not repeated herein. The difference between this embodiment and the first embodiment is that no second driving motor is disposed in the first casing 13. As shown in FIG. 8A, the second rotor 21 is directly pivotally connected to the second casing 24. The second rotor 21 can move along with the second casing 24, and the second rotor 21 also can rotate in the second casing 24.

When the fan module is in use, since the number of the driving motor is one, and the driving motor is connected to the first rotor 11. Consequently, to rotate the second rotor 21, the second blade 212 of the second rotor 21 is partly inserted into a position between the two first blades 112 of the first rotor 11 to make the second blade 212 overlap with the first blade 112. When the first driving motor 30 drives the first rotor 11 to rotate, the second blade 212 rotates synchronously under the guidance of the guiding member 22. As shown in FIG. 8A and FIG. 8B, the second casing 24 is able to move relative to the first casing 10 to adjust the size of the overlapped area (or an overlapped projected area) between the second blade 212 and the first blade 112, and then the height of the fan blade is adjusted.

Further, no second recessed part 23 (which is shown in the first embodiment) is formed at the outer surface of the second casing 24. In an embodiment, an outer diameter of the outer surface of the second casing 24 is slightly less than an inner diameter of the first recessed part 12 formed by the inner surface of the first casing 10. Then, when the second casing 24 moves close to the first casing 10, an end of the second casing 24 is accommodated in the first recessed part 12 (as shown in FIG. 8B). When the second casing 24 continually moves close to the first casing 10, the end of the second casing 24 is finally positioned in the first recessed part 12 while the short side portion of the first recessed part 12 abuts against the end of the second casing 24 (as shown in FIG. 8A). At the time, the second rotating shaft 211 of the second rotor 21 and the first rotating shaft 111 of the first rotor 11 do not contact and interfere with each other.

Although the invention has been disclosed with reference to certain embodiments thereof, the disclosure is not for limiting the scope. Persons having ordinary skill in the art may make various modifications and changes without departing from the scope of the invention. Therefore, the scope of the appended claims should not be limited to the description of the embodiments described above.

What is claimed is:

1. A fan module comprising,
a first casing;
a first driving motor disposed in the first casing;
a first rotor connected to the first driving motor, wherein the first rotor includes a first rotating shaft and a plurality of first blades, the plurality of first blades are connected to the first rotating shaft;
a second casing;
a second rotor pivotally configured in the second casing, wherein the second rotor includes a second rotating shaft and a plurality of second blades, the plurality of second blades are connected to the second rotating shaft;
at least one guiding member disposed on at least one blade of the plurality of first blades or at least one blade of the plurality of second blades; and
a shift apparatus connected to the first casing and the second casing, configured to drive the second casing to move relative to the first casing.

2. The fan module according to claim 1, wherein the fan module further includes a second driving motor, and the second driving motor is disposed in the second casing to drive the second rotor to rotate, wherein the second rotating shaft is connected to the second driving motor, and the plurality of second blades are connected to the second driving motor.

3. The fan module according to claim 1, wherein when the second casing is connected to the first casing, each blade of the plurality of second blades is partly located between two blades of the plurality of first blades.

4. The fan module according to claim 1, wherein when the second casing is connected to the first casing, a surface of one blade of the plurality of second blades is partly overlapped with a surface of one blade of the plurality of first blades in a direction perpendicular to the surface.

5. The fan module according to claim 1, wherein the shift apparatus is a scissor-shaped linkage to adjust the second casing to move relative to the first casing.

6. The fan module according to claim 1, wherein the shift apparatus includes a top cover and a bottom cover of an electronic device, the first casing is fixed to the bottom cover, the second casing is fixed to the top cover, and the top cover is driven to move relative to the bottom cover.

7. The fan module according to claim 1, wherein the at least one guiding member is in a cone shape.

8. The fan module according to claim 1, wherein the at least one guiding member is disposed on one blade of the plurality of first blades, and when the second casing is connected to the first casing, the at least one guiding member is located between two blades of the plurality of second blades.

9. The fan module according to claim 1, wherein a width of the at least one guiding member is equal to or less than a width between the two blades of the plurality of second blades.

10. The fan module according to claim 1, wherein an inner surface of the first casing includes a recessed part, when the second casing is connected to the first casing, an end portion of the second casing is accommodated and positioned in the recessed part.

11. The fan module according to claim 1, wherein a recessed part is formed at an outer surface of the second casing, when the second casing is connected to the first casing, an end portion of the first casing is accommodated and positioned in the recessed part.

12. The fan module according to claim 1, wherein a first recessed part is formed at an inner surface of the first casing, a second recessed part is formed at an outer surface of the second casing, when the second casing is connected to the first casing, an end of the second casing is accommodated and positioned in the first recessed part, and an end of the first casing is accommodated and positioned in the second recessed part.

* * * * *